United States Patent
Kim et al.

(10) Patent No.: US 8,671,336 B2
(45) Date of Patent: *Mar. 11, 2014

(54) METHOD FOR DETERMINING TRANSPORT BLOCK SIZE AND SIGNAL TRANSMISSION METHOD USING THE SAME

(75) Inventors: Bong Hoe Kim, Anyang-Si (KR); Ki Jun Kim, Anyang-Si (KR); Joon Kui Ahn, Anyang-Si (KR); Dong Youn Seo, Anyang-Si (KR)

(73) Assignee: LG Electronics Inc., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/584,561

(22) Filed: Aug. 13, 2012

(65) Prior Publication Data
US 2012/0311414 A1   Dec. 6, 2012

Related U.S. Application Data

(63) Continuation of application No. 12/332,165, filed on Dec. 10, 2008, now Pat. No. 8,266,513.

(60) Provisional application No. 61/024,914, filed on Jan. 31, 2008, provisional application No. 61/026,143, filed on Feb. 5, 2008.

(30) Foreign Application Priority Data

Oct. 6, 2008   (KR) .......................... 10-2008-0097705

(51) Int. Cl.
*G06F 11/00* (2006.01)

(52) U.S. Cl.
USPC ............................ 714/807; 714/799; 714/758

(58) Field of Classification Search
USPC ................. 714/755, 758, 752, 799, 807, 781
See application file for complete search history.

(56) References Cited

U.S. PATENT DOCUMENTS

| | | | |
|---|---|---|---|
| 5,724,391 | A | 3/1998 | Takeuchi et al. |
| 7,583,968 | B2 | 9/2009 | Kimura |
| 2002/0194566 | A1 | 12/2002 | Bellier et al. |
| 2003/0123409 | A1 | 7/2003 | Kwak et al. |
| 2004/0014447 | A1 | 1/2004 | Hepler et al. |
| 2004/0187062 | A1 | 9/2004 | Kajita |
| 2005/0208973 | A1 | 9/2005 | Iochi |
| 2006/0041820 | A1 | 2/2006 | Hang et al. |

(Continued)

FOREIGN PATENT DOCUMENTS

| | | |
|---|---|---|
| CN | 1366737 A | 8/2002 |
| JP | 2010-537460 A | 12/2010 |
| JP | 2010-539840 A | 12/2010 |
| WO | WO 02/089376 A1 | 11/2002 |

OTHER PUBLICATIONS

Motorola et al., "Remaining details of MCS/TBS Signaling," 3GPP TSG RAN1#53, R1-082211, Kansa City, MO, USA, May 5-9, 2008, 4 pages.*

(Continued)

*Primary Examiner* — Scott Baderman
*Assistant Examiner* — Jason Bryan
(74) *Attorney, Agent, or Firm* — Birch, Stewart, Kolasch & Birch, LLP

(57) ABSTRACT

A device and method for attaching a CRC code to a transport block and turbo encoding the CRC attached transport block, where the transport block has a predetermined size.

10 Claims, 6 Drawing Sheets

(56) References Cited

U.S. PATENT DOCUMENTS

| | | | |
|---|---|---|---|
| 2008/0098273 A1* | 4/2008 | Blankenship et al. | 714/746 |
| 2008/0225784 A1 | 9/2008 | Tseng | |
| 2008/0240030 A1 | 10/2008 | Kolding et al. | |
| 2009/0077447 A1* | 3/2009 | Buckley et al. | 714/757 |
| 2009/0077456 A1 | 3/2009 | Pi et al. | |
| 2010/0061345 A1 | 3/2010 | Wengerter et al. | |
| 2010/0077265 A1* | 3/2010 | Wei et al. | 714/701 |
| 2010/0205518 A1 | 8/2010 | Golitschek Edler von Elbwart | |

OTHER PUBLICATIONS

Ericsson et al., "Way forward for CRC attachment for turbo-coded transport channels," 3GPP TSG-RAN Working Group 1 #50, R1-073843, Athens, Greece, Aug. 20-24, 2007, 1 page.

3GPP TSG-RANWorking Group 1, AdHoc 21, TSGR1(00)0827, "Examples of Service Mapping for Low Chip Rate TDD Option", vol. RAN WG1, No. Oulu, Jun. 29, 2000, XP050092780.

3rd Generation Partnership Project,"Technical Specification Group Radio Access Network; Evolved Universal Terrestrial Radio Access (E-UTRA); Multiplexing and channel coding (Release 8)," 3GPP TS 36.212 V8.1.0, Nov. 2007, pp. 1-39.

Crozier, "Turbo-Code Design Issues: Trellis Termination Methods, Interleaving Strategies, and Implementation Complexity", ICC Communications Research Center (CRC), pp. 1-36, Jun. 1, 1999, XP002668411.

Kong et al., "Interleaved Cyclic Redundancy Check (CRC) Code", IEEE, vol. 2, pp. 2137-2141, Nov. 9, 2003, XP010701933.

3GPP, "Technical Specification Group Radio Access Network; Evolved Universal Terrestrial radio Access (E-UTRA); Base Station (BS) radio transmission and reception (Release 8)," 3GPP TS 36.104 v8.0.0, Dec. 2007, 1-47 pages.

Catt et al., "MCS handling for DwPTS," 3GPP TSG-RAN WG1 #55, R1-084274, Prague, Czech Republic, Nov. 10-14, 2008, 15 pages.

Motorola et al., "Remaining details of MCS/TBS signalling," 3GPP TSG RAN1#53, R1-082211, Kansas City, MO, USA, May 5-9, 2008, 4 pages.

LG Electronics, "Clarification of spatial different CQI for CQI reporting Mode 2-1," 3GPP TSG-RAN1 Meeting #55, R1-084193, Prague, Czech Republic, Nov. 10-14, 2008, 9 pages.

LG Electronics, "Considerations on TB size selection," 3GPP TSG RAN WG1 #52, R1-080998, Sorrento, Italy, Feb. 11-15, 2008, 5 pages.

LG Electronics, "Considerations on the design of transport block size table," 3GPP TSG RAN WG1 #52bis, R1-081250, Shenzhen, China, Mar. 31-Apr. 4, 2008, 12 pages.

* cited by examiner

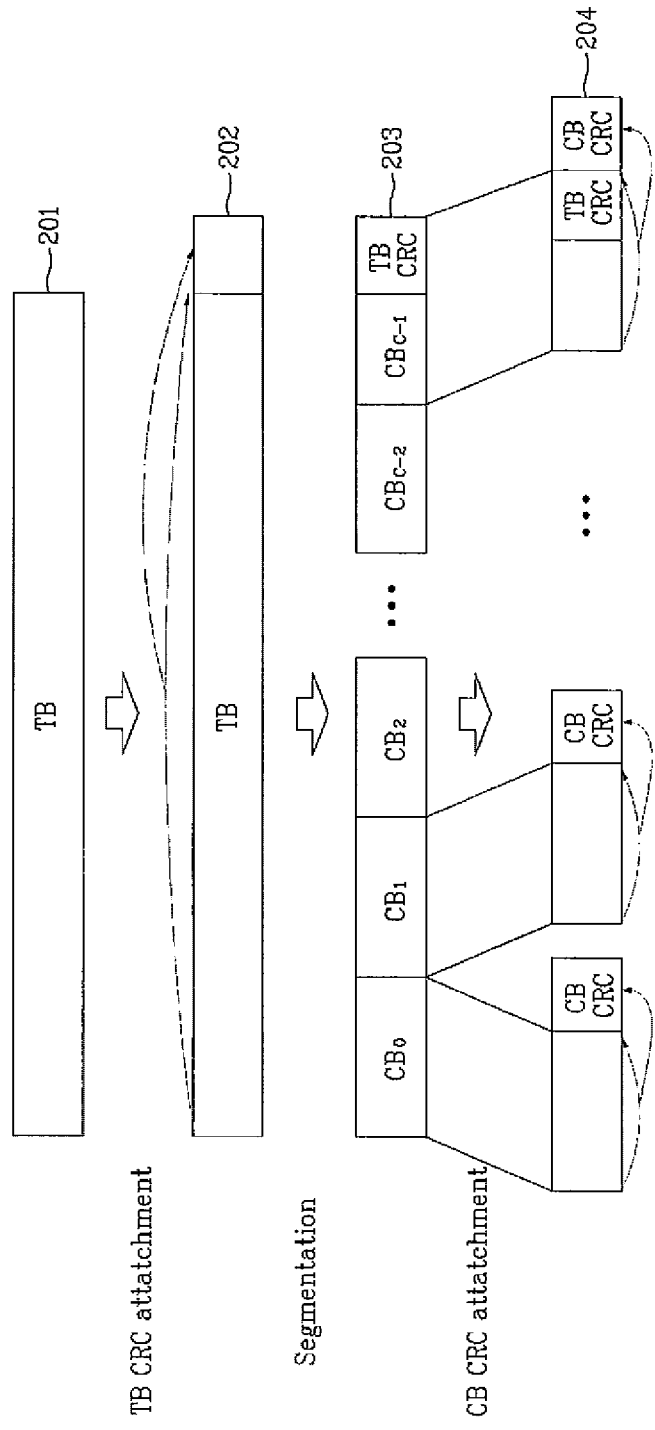

METHOD FOR DETERMINING TRANSPORT BLOCK SIZE AND SIGNAL TRANSMISSION METHOD USING THE SAME

CROSS REFERENCE TO RELATED APPLICATIONS

This application is a Continuation of application Ser. No. 12/332,165 filed on Dec. 10, 2008 now U.S. Pat. No. 8,266,513, which claims priority to Korean Patent Application 10-2008-0097705, filed on Oct. 6, 2008, U.S. Provisional Application 61/024,914 filed on Jan. 31, 2008 and U.S. Provisional Application 61/026,143 filed on Feb. 5, 2008. The entire contents of all of the above applications are hereby incorporated by reference.

BACKGROUND OF THE INVENTION

1. Field of the Invention

The present invention relates to a method and device for effectively determining the size of a data block or a transport block in a wireless communication system, and a method for transmitting signals using the same method.

2. Discussion of the Background Art

Generally, in a communication system, a transmission end of the communication system encodes transmission information using a forward error correction code, and transmits the encoded information to a reception end of the communication system, such that errors caused by a channel can be corrected in the information received in the reception end. The reception end demodulates a reception signal, decodes a forward error correction code, and recovers the transmission information transferred from the transmission end. During this decoding process, reception signal errors caused by a channel can be corrected.

There are various kinds of forward error correction codes that may be used. For the convenience of description, a turbo code will hereinafter be described as an example of the forward error correction code. The turbo code includes a recursive systematic convolution encoder and an interleaver. In case of actually implementing the turbo code, the interleaver facilitates parallel decoding, and an example of this interleaver may be a quadratic polynomial permutation (QPP) interleaver. It is well known in the art that this QPP interleaver maintains a superior throughput or performance in only a specific-sized data block. In this case, the term "data block" is block unit data encoded by the encoder. If we think block unit data transferred from an upper layer to a physical layer is encoded without segmentation discussed below, this data block may also be called as a transport block (TB). On the other hand, if we think the segmentation of the transport block to be encoded, this data block may be matched to "a code block".

In general, the larger the data-block size, the higher the turbo-code performance. A data block of more than a specific size is segmented into a plurality of small-sized data blocks by an actual communication system, such that the small-sized data blocks are encoded for the convenience of actual implementation. The divided small-sized data blocks are called code blocks. Generally, although these code blocks have the same size, one of several code blocks may have another size due to the limitation of the QPP interleaver size. A forward error correction coding process on the basis of a code block of a predetermined interleaver size is performed on the small-sized data blocks, and the resultant data blocks are then transferred to an RF (Radio Frequency) channel. In this case, a burst error may occur in the above process of transferring the resultant data blocks to the RF channel, such that the above resultant data blocks are interleaved to reduce an influence of the burst error. The interleaved data blocks are mapped to actual radio resources, such that the mapped result is transferred.

An amount of radio resources used in an actual transmission process is constant, such that a rate matching process should be performed on the encoded code blocks due to the constant amount of radio resources. Generally, the rate matching process is implemented by a puncturing or a repetition. For example, the rate matching may also be performed on the basis of an encoded code block in the same manner as in a WCDMA of the 3GPP. For another example, a systematic part and a parity part of the encoded code block may be separated from each other. The rate matching process may be performed on the systematic part and the parity part together. On the other hand, the rate matching process may also be independently performed on each of the systematic part and the parity part.

FIG. 1 is a conceptual diagram illustrating basic operations of a turbo encoder.

As shown in FIG. 1, if a turbo-encoder receives one code block, it divides the received one code block into a systematic part (S) and parity parts (P1 and P2). The systematic part S and the parity parts P1 and P2 pass through individual sub-block interleavers, respectively. Thus, the systematic part S and the parity parts P1 and P2 may be interleaved by different sub-block interleavers, and the interleaved result is stored in a circular buffer.

As can be seen from FIG. 1, the systematic part and the parity parts of the code block may be separated from each other, and the rate matching process is performed on the individual separated parts, but the example of FIG. 1 has been disclosed for only illustrative purposes and the scope and spirit of the present invention are not limited to this example and can also be applied to other examples. For the convenience of description, it is assumed that a code rate is a value of 1/3.

Although a variety of transport block sizes may be defined according to service categories of an upper layer, it is preferable that the transport block sizes may be quantized to effectively perform the signaling of various transport block sizes. During the quantization process, in order to adjust a source data block transferred from an upper layer to the size of a data block of a physical layer, a dummy bit is added to the source data block. During this quantization process, it is preferable to minimize the amount of added dummy bits.

SUMMARY OF THE INVENTION

To achieve these objects and other advantages and in accordance with the purpose of the invention, as embodied and broadly described herein, a signal transmission method and device is presented, the method comprising: determining the number of code blocks to be used for transmitting a transport block with a specific size, and mapping the transport block to the code blocks corresponding to the determined number; attaching a cyclic redundancy check (CRC) to each of the code blocks; encoding each of the CRC-attached code blocks by a turbo-encoder including an internal interleaver; and transmitting the encoded code blocks, wherein the specific size of the transport block corresponds to any transport block size in predetermined transport block size combinations, and wherein any transport block size in the predetermined transport block size combinations is predetermined such that the sum of a length of any one code block from among the code blocks mapped to the transport block with the specific length and a length of the CRC attached to the one code block is equal to a block size of the internal interleaver.

The block size of the internal interleaver of the turbo-encoder may be predetermined as a combination of predetermined bit lengths.

Under the above-mentioned assumption, if the number of code blocks to be used for transmitting the transport block is 1, the specific transport block size may be any one of the predetermined transport block size combinations in which any one of the predetermined transport block size corresponds to the sum of a CRC length and the predetermined internal interleaver's block sizes.

Under the same assumption, if the number of code blocks to be used for transmitting the transport block is at least 2, the transport block is segmented into at least two code blocks having the same length, and is mapped to the at least two code blocks.

The above-mentioned operations may be generalized as the following expression.

If the specific size of the transport block is N, the number of the code blocks to be used for transmitting the transport block is M, the length of each of the M code blocks is $N_c$, and the length of the CRC is L, the specific transport block size N may satisfy an equation denoted by $N=M*N_C-L$, and the specific transport block size may correspond to any one of the predetermined transport block size combinations in which a value of Nc+L corresponds to the internal interleaver's block sizes predetermined as a combination of predetermined bit lengths.

In more detail, the block size of the internal interleaver of the turbo-encoder may predetermined as 'K' value according to an index (i) in a following Table 1:

TABLE 1

| i | K |
|---|---|
| 1 | 40 |
| 2 | 48 |
| 3 | 56 |
| 4 | 64 |
| 5 | 72 |
| 6 | 80 |
| 7 | 88 |
| 8 | 96 |
| 9 | 104 |
| 10 | 112 |
| 11 | 120 |
| 12 | 128 |
| 13 | 136 |
| 14 | 144 |
| 15 | 152 |
| 16 | 160 |
| 17 | 168 |
| 18 | 176 |
| 19 | 184 |
| 20 | 192 |
| 21 | 200 |
| 22 | 208 |
| 23 | 216 |
| 24 | 224 |
| 25 | 232 |
| 26 | 240 |
| 27 | 248 |
| 28 | 256 |
| 29 | 264 |
| 30 | 272 |
| 31 | 280 |
| 32 | 288 |
| 33 | 296 |
| 34 | 304 |
| 35 | 312 |
| 36 | 320 |
| 37 | 328 |
| 38 | 336 |

TABLE 1-continued

| i | K |
|---|---|
| 39 | 344 |
| 40 | 352 |
| 41 | 360 |
| 42 | 368 |
| 43 | 376 |
| 44 | 384 |
| 45 | 392 |
| 46 | 400 |
| 47 | 408 |
| 48 | 416 |
| 49 | 424 |
| 50 | 432 |
| 51 | 440 |
| 52 | 448 |
| 53 | 456 |
| 54 | 464 |
| 55 | 472 |
| 56 | 480 |
| 57 | 488 |
| 58 | 496 |
| 59 | 504 |
| 60 | 512 |
| 61 | 528 |
| 62 | 544 |
| 63 | 560 |
| 64 | 576 |
| 65 | 592 |
| 66 | 608 |
| 67 | 624 |
| 68 | 640 |
| 69 | 656 |
| 70 | 672 |
| 71 | 688 |
| 72 | 704 |
| 73 | 720 |
| 74 | 736 |
| 75 | 752 |
| 76 | 768 |
| 77 | 784 |
| 78 | 800 |
| 79 | 816 |
| 80 | 832 |
| 81 | 848 |
| 82 | 864 |
| 83 | 880 |
| 84 | 896 |
| 85 | 912 |
| 86 | 928 |
| 87 | 944 |
| 88 | 960 |
| 89 | 976 |
| 90 | 992 |
| 91 | 1008 |
| 92 | 1024 |
| 93 | 1056 |
| 94 | 1088 |
| 95 | 1120 |
| 96 | 1152 |
| 97 | 1184 |
| 98 | 1216 |
| 99 | 1248 |
| 100 | 1280 |
| 101 | 1312 |
| 102 | 1344 |
| 103 | 1376 |
| 104 | 1408 |
| 105 | 1440 |
| 106 | 1472 |
| 107 | 1504 |
| 108 | 1536 |
| 109 | 1568 |
| 110 | 1600 |
| 111 | 1632 |
| 112 | 1664 |
| 113 | 1696 |
| 114 | 1728 |
| 115 | 1760 |
| 116 | 1792 |

TABLE 1-continued

| i | K |
| --- | --- |
| 117 | 1824 |
| 118 | 1856 |
| 119 | 1888 |
| 120 | 1920 |
| 121 | 1952 |
| 122 | 1984 |
| 123 | 2016 |
| 124 | 2048 |
| 125 | 2112 |
| 126 | 2176 |
| 127 | 2240 |
| 128 | 2304 |
| 129 | 2368 |
| 130 | 2432 |
| 131 | 2496 |
| 132 | 2560 |
| 133 | 2624 |
| 134 | 2688 |
| 135 | 2752 |
| 136 | 2816 |
| 137 | 2880 |
| 138 | 2944 |
| 139 | 3008 |
| 140 | 3072 |
| 141 | 3136 |
| 142 | 3200 |
| 143 | 3264 |
| 144 | 3328 |
| 145 | 3392 |
| 146 | 3456 |
| 147 | 3520 |
| 148 | 3584 |
| 149 | 3648 |
| 150 | 3712 |
| 151 | 3776 |
| 152 | 3840 |
| 153 | 3904 |
| 154 | 3968 |
| 155 | 4032 |
| 156 | 4096 |
| 157 | 4160 |
| 158 | 4224 |
| 159 | 4288 |
| 160 | 4352 |
| 161 | 4416 |
| 162 | 4480 |
| 163 | 4544 |
| 164 | 4608 |
| 165 | 4672 |
| 166 | 4736 |
| 167 | 4800 |
| 168 | 4864 |
| 169 | 4928 |
| 170 | 4992 |
| 171 | 5056 |
| 172 | 5120 |
| 173 | 5184 |
| 174 | 5248 |
| 175 | 5312 |
| 176 | 5376 |
| 177 | 5440 |
| 178 | 5504 |
| 179 | 5568 |
| 180 | 5632 |
| 181 | 5696 |
| 182 | 5760 |
| 183 | 5824 |
| 184 | 5888 |
| 185 | 5952 |
| 186 | 6016 |
| 187 | 6080 |
| 188 | 6144 |

Under the above-mentioned assumption, if the number of code blocks to be used for transmitting the transport block is 1, the specific transport block size may be any one of the transport block size combinations in which any transport block size corresponds to the sum of a K value shown in Table 1 and a CRC length.

The above-mentioned operations may be generalized as the following expression.

If the specific size of the transport block is N, the number of the code blocks to be used for transmitting the transport block is M, the length of each of the M code blocks is $N_c$, and the length of the CRC is L, the specific transport block size N may satisfy an equation denoted by $N=M*N_c-L$, and the specific transport block size may correspond to any one of transport block size combinations in which a value of Nc+L corresponds to the K value shown in the above table 1.

The specific size N of the transport block may be set to a length selected from among combinations shown in a following table 2 according to the number M of the code blocks to be used for transmitting the transport block.

TABLE 2

| M | N |
| --- | --- |
| 2 | 6200 |
| 2 | 6328 |
| 2 | 6456 |
| 2 | 6584 |
| 2 | 6712 |
| 2 | 6840 |
| 2 | 6968 |
| 2 | 7096 |
| 2 | 7224 |
| 2 | 7352 |
| 2 | 7480 |
| 2 | 7608 |
| 2 | 7736 |
| 2 | 7864 |
| 2 | 7992 |
| 2 | 8120 |
| 2 | 8248 |
| 2 | 8376 |
| 2 | 8504 |
| 2 | 8632 |
| 2 | 8760 |
| 2 | 8888 |
| 2 | 9016 |
| 2 | 9144 |
| 2 | 9272 |
| 2 | 9400 |
| 2 | 9528 |
| 2 | 9656 |
| 2 | 9784 |
| 2 | 9912 |
| 2 | 10040 |
| 2 | 10168 |
| 2 | 10296 |
| 2 | 10424 |
| 2 | 10552 |
| 2 | 10680 |
| 2 | 10808 |
| 2 | 10936 |
| 2 | 11064 |
| 2 | 11192 |
| 2 | 11320 |
| 2 | 11448 |
| 2 | 11576 |
| 2 | 11704 |
| 2 | 11832 |
| 2 | 11960 |
| 2 | 12088 |
| 2 | 12216 |
| 3 | 12384 |
| 3 | 12576 |
| 3 | 12768 |
| 3 | 12960 |
| 3 | 13152 |
| 3 | 13344 |
| 3 | 13536 |

TABLE 2-continued

| M | N |
|---|---|
| 3 | 13728 |
| 3 | 13920 |
| 3 | 14112 |
| 3 | 14304 |
| 3 | 14496 |
| 3 | 14688 |
| 3 | 14880 |
| 3 | 15072 |
| 3 | 15264 |
| 3 | 15456 |
| 3 | 15648 |
| 3 | 15840 |
| 3 | 16032 |
| 3 | 16224 |
| 3 | 16416 |
| 3 | 16608 |
| 3 | 16800 |
| 3 | 16992 |
| 3 | 17184 |
| 3 | 17376 |
| 3 | 17568 |
| 3 | 17760 |
| 3 | 17952 |
| 3 | 18144 |
| 3 | 18336 |
| 4 | 18568 |
| 4 | 18824 |
| 4 | 19080 |
| 4 | 19336 |
| 4 | 19592 |
| 4 | 19848 |
| 4 | 20104 |
| 4 | 20360 |
| 4 | 20616 |
| 4 | 20872 |
| 4 | 21128 |
| 4 | 21384 |
| 4 | 21640 |
| 4 | 21896 |
| 4 | 22152 |
| 4 | 22408 |
| 4 | 22664 |
| 4 | 22920 |
| 4 | 23176 |
| 4 | 23432 |
| 4 | 23688 |
| 4 | 23944 |
| 4 | 24200 |
| 4 | 24456 |
| 5 | 24496 |
| 5 | 24816 |
| 5 | 25136 |
| 5 | 25456 |
| 5 | 25776 |
| 5 | 26096 |
| 5 | 26416 |
| 5 | 26736 |
| 5 | 27056 |
| 5 | 27376 |
| 5 | 27696 |
| 5 | 28016 |
| 5 | 28336 |
| 5 | 28656 |
| 5 | 28976 |
| 5 | 29296 |
| 5 | 29616 |
| 5 | 29936 |
| 5 | 30256 |
| 5 | 30576 |
| 6 | 30936 |
| 6 | 31320 |
| 6 | 31704 |
| 6 | 32088 |
| 6 | 32472 |
| 6 | 32856 |
| 6 | 33240 |
| 6 | 33624 |
| 6 | 34008 |

TABLE 2-continued

| M | N |
|---|---|
| 6 | 34392 |
| 6 | 34776 |
| 6 | 35160 |
| 6 | 35544 |
| 6 | 35928 |
| 6 | 36312 |
| 6 | 36696 |
| 7 | 36992 |
| 7 | 37440 |
| 7 | 37888 |
| 7 | 38336 |
| 7 | 38784 |
| 7 | 39232 |
| 7 | 39680 |
| 7 | 40128 |
| 7 | 40576 |
| 7 | 41024 |
| 7 | 41472 |
| 7 | 41920 |
| 7 | 42368 |
| 7 | 42816 |
| 8 | 43304 |
| 8 | 43816 |
| 8 | 44328 |
| 8 | 44840 |
| 8 | 45352 |
| 8 | 45864 |
| 8 | 46376 |
| 8 | 46888 |
| 8 | 47400 |
| 8 | 47912 |
| 8 | 48424 |
| 8 | 48936 |
| 8 | 49296 |
| 8 | 49872 |
| 9 | 50448 |
| 9 | 51024 |
| 9 | 51600 |
| 9 | 52176 |
| 9 | 52752 |
| 9 | 53328 |
| 9 | 53904 |
| 9 | 54480 |
| 9 | 55056 |
| 10 | 55416 |
| 10 | 56056 |
| 10 | 56696 |
| 10 | 57336 |
| 10 | 57976 |
| 10 | 58616 |
| 10 | 59256 |
| 10 | 59896 |
| 10 | 60536 |
| 10 | 61176 |
| 11 | 61664 |
| 11 | 62368 |
| 11 | 63072 |
| 11 | 63776 |
| 11 | 64480 |
| 11 | 65184 |
| 11 | 65888 |
| 11 | 66592 |
| 11 | 67296 |
| 12 | 68040 |
| 12 | 68808 |
| 12 | 69576 |
| 12 | 70344 |
| 12 | 71112 |
| 12 | 71880 |
| 12 | 72648 |
| 12 | 73416 |
| 13 | 73712 |
| 13 | 74544 |
| 13 | 75376 |
| 13 | 76208 |
| 13 | 77040 |
| 13 | 77872 |
| 13 | 78704 |

TABLE 2-continued

| M | N |
|---|---|
| 13 | 79536 |
| 14 | 80280 |
| 14 | 81176 |
| 14 | 82072 |
| 14 | 82968 |
| 14 | 83864 |
| 14 | 84760 |
| 14 | 85656 |
| 15 | 86016 |
| 15 | 86976 |
| 15 | 87936 |
| 15 | 88896 |
| 15 | 89856 |
| 15 | 90816 |
| 15 | 91776 |
| 16 | 92776 |
| 16 | 93800 |
| 16 | 94824 |
| 16 | 95848 |
| 16 | 96872 |
| 16 | 97896 |
| 17 | 98576 |
| 17 | 99664 |
| 17 | 100752 |
| 17 | 101840 |
| 17 | 102928 |
| 17 | 104016 |
| 18 | 104376 |
| 18 | 105528 |
| 18 | 106680 |
| 18 | 107832 |
| 18 | 108984 |
| 18 | 110136 |
| 19 | 110176 |
| 19 | 111392 |
| 19 | 112608 |
| 19 | 113824 |
| 19 | 115040 |
| 19 | 116256 |
| 20 | 117256 |
| 20 | 118536 |
| 20 | 119816 |
| 20 | 121096 |
| 20 | 122376 |
| 21 | 123120 |
| 21 | 124464 |
| 21 | 125808 |
| 21 | 127152 |
| 21 | 128496 |
| 22 | 130392 |
| 22 | 131800 |
| 22 | 133208 |
| 22 | 134616 |
| 23 | 134848 |
| 23 | 136320 |
| 23 | 137792 |
| 23 | 139264 |
| 23 | 140736 |

TABLE 2-continued

| M | N |
|---|---|
| 24 | 142248 |
| 24 | 143784 |
| 24 | 145320 |
| 24 | 146856 |
| 25 | 148176 |
| 25 | 149776 |
| 25 | 151376 |
| 25 | 152976 |

The method may further comprise: receiving information indicating a Modulation and Coding Scheme (MCS) and an available resource area size from a reception end; and determining the specific transport block size based on the received information from the predetermined transport block size combinations.

And, if the transport block size value based on the received information is not contained in the predetermined transport block size combinations, a maximum transport block size in the predetermined transport block size combinations, which is equal to or smaller than the transport block size value based on the received information; a minimum transport block size in the predetermined transport block size combinations, which is larger than the transport block size value based on the received information; or a specific transport block size in the predetermined transport block size combinations, which has a minimum difference with the transport block size value based on the received information, may be used as the specific transport block size.

In another aspect of the present invention, there is provided a signal transmission method comprising: attaching a first cyclic redundancy check (CRC) having a length of L to a transport block having a length of N; segmenting the transport block to which the first CRC is attached into M number of code blocks, each of which has a length of $N_c$; attaching a second cyclic redundancy check (CRC) having a length of L to each of the M code blocks; encoding, by a turbo-encoder comprising an internal interleaver, the M code blocks, each of which has the second CRC; and transmitting the encoded M code blocks, wherein the transport block size N satisfies an equation denoted by $N=M*N_C-L$ (where $N$, $N_c$, $M$, and $L$ are natural numbers), where a value of Nc+L has any one of block sizes of the internal interleaver of the turbo-encoder.

In another aspect of the present invention, there is provided a signal transmission method comprising: mapping a transport block having a length of N to at least one code block; encoding the at least one code block by a turbo-encoder comprising an internal interleaver; and transmitting the encoded code block, wherein the transport block size N is selected from a transport block size combination comprising all or some of values shown in a following table 3.

TABLE 3

| | | | | | | | | | |
|---|---|---|---|---|---|---|---|---|---|
| 16 | 392 | 1096 | 3176 | 6200 | 12216 | 22152 | 37440 | 62368 | 101840 |
| 24 | 400 | 1128 | 3240 | 6328 | 12384 | 22408 | 37888 | 63072 | 102928 |
| 32 | 408 | 1160 | 3304 | 6456 | 12576 | 22664 | 38336 | 63776 | 104016 |
| 40 | 416 | 1192 | 3368 | 6584 | 12768 | 22920 | 38784 | 64480 | 104376 |
| 48 | 424 | 1224 | 3432 | 6712 | 12960 | 23176 | 39232 | 65184 | 105528 |
| 56 | 432 | 1256 | 3496 | 6840 | 13152 | 23432 | 39680 | 65888 | 106680 |
| 64 | 440 | 1288 | 3560 | 6968 | 13344 | 23688 | 40128 | 66592 | 107832 |
| 72 | 448 | 1320 | 3624 | 7096 | 13536 | 23944 | 40576 | 67296 | 108984 |
| 80 | 456 | 1352 | 3688 | 7224 | 13728 | 24200 | 41024 | 68040 | 110136 |
| 88 | 464 | 1384 | 3752 | 7352 | 13920 | 24456 | 41472 | 68808 | 110176 |
| 96 | 472 | 1416 | 3816 | 7480 | 14112 | 24496 | 41920 | 69576 | 111392 |
| 104 | 480 | 1448 | 3880 | 7608 | 14304 | 24816 | 42368 | 70344 | 112608 |
| 112 | 488 | 1480 | 3944 | 7736 | 14496 | 25136 | 42816 | 71112 | 113824 |
| 120 | 504 | 1512 | 4008 | 7864 | 14688 | 25456 | 43304 | 71880 | 115040 |
| 128 | 520 | 1544 | 4072 | 7992 | 14880 | 25776 | 43816 | 72648 | 116256 |

TABLE 3-continued

| | | | | | | | | |
|---|---|---|---|---|---|---|---|---|
| 136 | 536 | 1576 | 4136 | 8120 | 15072 | 26096 | 44328 | 73416 | 117256 |
| 144 | 552 | 1608 | 4200 | 8248 | 15264 | 26416 | 44840 | 73712 | 118536 |
| 152 | 568 | 1640 | 4264 | 8376 | 15456 | 26736 | 45352 | 74544 | 119816 |
| 160 | 584 | 1672 | 4328 | 8504 | 15648 | 27056 | 45864 | 75376 | 121096 |
| 168 | 600 | 1704 | 4392 | 8632 | 15840 | 27376 | 46376 | 76208 | 122376 |
| 176 | 616 | 1736 | 4456 | 8760 | 16032 | 27696 | 46888 | 77040 | 123120 |
| 184 | 632 | 1768 | 4520 | 8888 | 16224 | 28016 | 47400 | 77872 | 124464 |
| 192 | 648 | 1800 | 4584 | 9016 | 16416 | 28336 | 47912 | 78704 | 125808 |
| 200 | 664 | 1832 | 4648 | 9144 | 16608 | 28656 | 48424 | 79536 | 127152 |
| 208 | 680 | 1864 | 4712 | 9272 | 16800 | 28976 | 48936 | 80280 | 128496 |
| 216 | 696 | 1896 | 4776 | 9400 | 16992 | 29296 | 49296 | 81176 | 130392 |
| 224 | 712 | 1928 | 4840 | 9528 | 17184 | 29616 | 49872 | 82072 | 131800 |
| 232 | 728 | 1960 | 4904 | 9656 | 17376 | 29936 | 50448 | 82968 | 133208 |
| 240 | 744 | 1992 | 4968 | 9784 | 17568 | 30256 | 51024 | 83864 | 134616 |
| 248 | 760 | 2024 | 5032 | 9912 | 17760 | 30576 | 51600 | 84760 | 134848 |
| 256 | 776 | 2088 | 5096 | 10040 | 17952 | 30936 | 52176 | 85656 | 136320 |
| 264 | 792 | 2152 | 5160 | 10168 | 18144 | 31320 | 52752 | 86016 | 137792 |
| 272 | 808 | 2216 | 5224 | 10296 | 18336 | 31704 | 53328 | 86976 | 139264 |
| 280 | 824 | 2280 | 5288 | 10424 | 18568 | 32088 | 53904 | 87936 | 140736 |
| 288 | 840 | 2344 | 5352 | 10552 | 18824 | 32472 | 54480 | 88896 | 142248 |
| 296 | 856 | 2408 | 5416 | 10680 | 19080 | 32856 | 55056 | 89856 | 143784 |
| 304 | 872 | 2472 | 5480 | 10808 | 19336 | 33240 | 55416 | 90816 | 145320 |
| 312 | 888 | 2536 | 5544 | 10936 | 19592 | 33624 | 56056 | 91776 | 146856 |
| 320 | 904 | 2600 | 5608 | 11064 | 19848 | 34008 | 56696 | 92776 | 148176 |
| 328 | 920 | 2664 | 5672 | 11192 | 20104 | 34392 | 57336 | 93800 | 149776 |
| 336 | 936 | 2728 | 5736 | 11320 | 20360 | 34776 | 57976 | 94824 | 151376 |
| 344 | 952 | 2792 | 5800 | 11448 | 20616 | 35160 | 58616 | 95848 | 152976 |
| 352 | 968 | 2856 | 5864 | 11576 | 20872 | 35544 | 59256 | 96872 | |
| 360 | 984 | 2920 | 5928 | 11704 | 21128 | 35928 | 59896 | 97896 | |
| 368 | 1000 | 2984 | 5992 | 11832 | 21384 | 36312 | 60536 | 98576 | |
| 376 | 1032 | 3048 | 6056 | 11960 | 21640 | 36696 | 61176 | 99664 | |
| 384 | 1064 | 3112 | 6120 | 12088 | 21896 | 36992 | 61664 | 100752 | | where, the N value is a natural number.

According to the above-mentioned embodiments of the present invention, if a transport block received from an upper layer is segmented into a plurality of code blocks, and the code blocks are encoded by a turbo-encoder, the present invention is able to avoid addition of dummy bits due to the length of an input bit of an internal interleaver of the turbo-encoder, such that it can effectively transmit signals.

DESCRIPTION OF THE DRAWINGS

The accompanying drawings, which are included to provide a further understanding of the invention, illustrate embodiments of the invention and together with the description serve to explain the principle of the invention.

In the drawings:

FIGS. 2A-2B and 3 are conceptual diagrams illustrating a method for dividing a long transport block into a plurality of short transport blocks in a 3GPP system, and attaching a CRC to the short transport blocks according to the present invention;

DETAILED DESCRIPTION OF THE INVENTION

Figure 1:
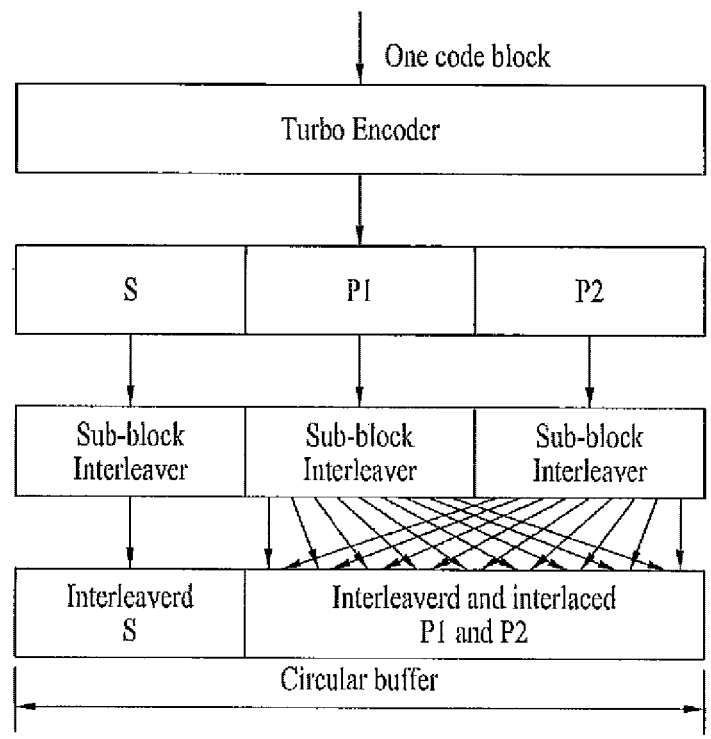
FIG. 1 is a conceptual diagram illustrating basic operations of a turbo-encoder according to the present invention.

Reference will now be made in detail to the preferred embodiments of the present invention, examples of which are illustrated in the accompanying drawings. Wherever possible, the same reference numbers will be used throughout the drawings to refer to the same or like parts. Prior to describing the present invention, it should be noted that most terms disclosed in the present invention correspond to general terms well known in the art, but some terms have been selected by the applicant as necessary and will hereinafter be disclosed in the following description of the present invention. Therefore, it is preferable that the terms defined by the applicant be understood on the basis of their meanings in the present invention.

For the convenience of description and better understanding of the present invention, the following detailed description will disclose a variety of embodiments and modifications of the present invention. In some cases, in order to prevent ambiguous concepts of the present invention from occurring, conventional devices or apparatus well known to those skilled in the art will be omitted and be denoted in the form of a block diagram on the basis of the important functions of the present invention. Wherever possible, the same reference numbers will be used throughout the drawings to refer to the same or like parts.

As described above, it is well known to those skilled in the art that the internal interleaver of the turbo code has a superior performance in only a specific-sized data block. If the data block size is larger than a predetermined size, a transport block or a data block is segmented into a plurality of code blocks, and this process is called segmentation. Due to the limitation of the interleaver size, the transport or data block may not be segmented into the same-sized code blocks.

However, in the case of a downlink, a channel quality indicator must be applied to all code blocks segmented from the data block, such that it is preferable that the transport or data block be segmented into the same-sized code blocks. If the data block size or the segmented code block size is different from the internal interleaver size of the turbo code, a dummy bit is inserted such that transmission efficiency is reduced. In order to solve this problem, it is preferable that the segmentation process be performed not to require this dummy bit.

For the above-mentioned operations, there is needed a consideration of the block size of the internal encoder of the turbo-encoder caused by the inserted dummy bit. In order to perform the channel coding, a CRC is attached to a transport block or code blocks segmented from the transport block, and at the same time the length of each data block is changed to another length, such that a consideration of the channel coding is needed.

Firstly, the above-mentioned CRC attachment process will hereinafter be described in detail.

The CRC for detecting errors is attached to the transport block received from an upper layer. For the convenience of implementation, and it can also be attached to each of the segmented code blocks.

Figure 2A:
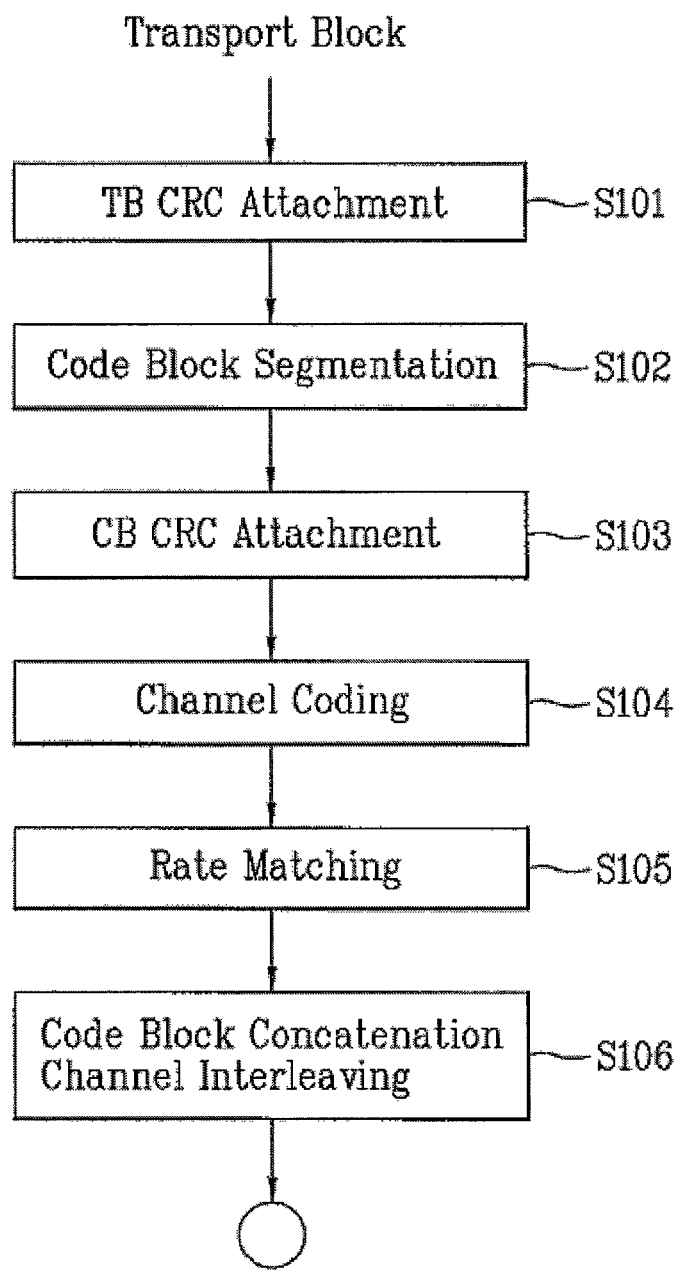
Figure 2B:
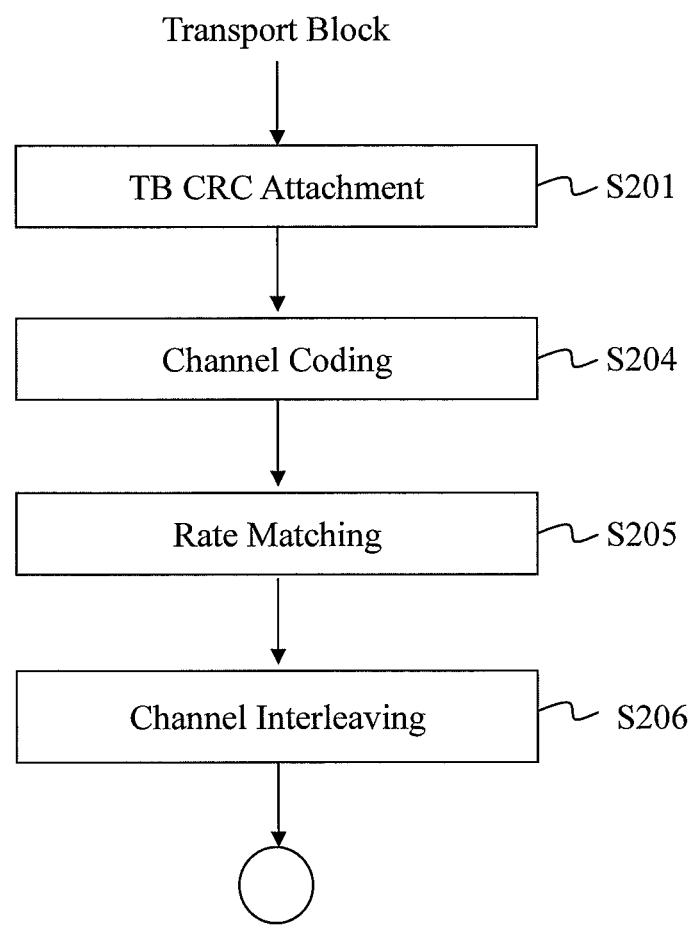

FIGS. 2A-2B and 3 are conceptual diagrams illustrating a method for dividing a long transport block into a plurality of short length code blocks in a 3GPP system, and attaching a CRC to the short code blocks according to the present invention.

The 3GPP system segments a long transport block (TB) into a plurality of short code blocks, encodes the short code blocks, collects the encoded short code blocks, and transmits the collected short code blocks. Detailed descriptions of the above operations of the 3GPP system will hereinafter be described with reference to FIGS. 2A-2B.

Referring to FIG. 2A, the long transport block is CRC-attached, that is, a CRC is attached to the transport block at step S101. Thereafter, the CRC-attached long transport block is segmented into a plurality of short code blocks at step S102. Similar to this, as shown in reference numbers 201~203 of FIG. 3, the CRC is attached to the long transport block, and the CRC-attached transport block is segmented into a plurality of code blocks. However, as shown in steps S201, S204, S205 and S206 of FIG. 2B, if the length of the transport block received from the upper layer is equal to or shorter than a predetermined length capable of being constructed by one code block, i.e., a maximum length of the internal interleaver of the turbo-encoder, the segmentation of the transport block may be omitted. In this case, the process for attaching a CB CRC may also be omitted.

In the meantime, each of short code blocks is CRC-attached, that is, the CRC attachment process is then performed on each of the code blocks at step S103. In more detail, as shown in the reference number 204 of FIG. 3, each of the code blocks includes a CRC.

Also, the code blocks, each of which includes the CRC, are applied to a channel encoder, such that the channel coding process is performed on the resultant code blocks at step S104. Thereafter, the rate matching process S105, and the code block concatenation and channel interleaving process S106 are sequentially applied to the individual code blocks, such that the resultant code blocks are transmitted to a reception end.

Therefore, according to the following embodiment, there is proposed a process for determining the size of a transport block in consideration of the two-stage CRC attachment process. In the case where the size of a transport block is less than a predetermined size (such as, maximum internal interleaver size) and this transport block is mapped to one code block, the embodiment of the present invention provides a method for establishing the transport block size in consideration of only one CRC.

Under the above-mentioned assumption, a method for mapping the transport block to one code block will hereinafter be described. In order to remove the necessity of the conventional art of attaching the dummy bit on the condition that the transport block is mapped to one codeword, this embodiment of the present invention allows the sum of the transport block size (N) and one CRC length to be equal to an block size of the internal interleaver of the turbo-interleaver. The following Table 1 represents a combination of block sizes of the internal interleaver of the turbo-encoder.

TABLE 1

| i | K |
|---|---|
| 1 | 40 |
| 2 | 48 |
| 3 | 56 |
| 4 | 64 |
| 5 | 72 |
| 6 | 80 |
| 7 | 88 |
| 8 | 96 |
| 9 | 104 |
| 10 | 112 |
| 11 | 120 |
| 12 | 128 |
| 13 | 136 |
| 14 | 144 |
| 15 | 152 |
| 16 | 160 |
| 17 | 168 |
| 18 | 176 |
| 19 | 184 |
| 20 | 192 |
| 21 | 200 |
| 22 | 208 |
| 23 | 216 |
| 24 | 224 |
| 25 | 232 |
| 26 | 240 |
| 27 | 248 |
| 28 | 256 |
| 29 | 264 |
| 30 | 272 |
| 31 | 280 |
| 32 | 288 |
| 33 | 296 |
| 34 | 304 |
| 35 | 312 |
| 36 | 320 |
| 37 | 328 |
| 38 | 336 |
| 39 | 344 |
| 40 | 352 |
| 41 | 360 |
| 42 | 368 |
| 43 | 376 |
| 44 | 384 |
| 45 | 392 |
| 46 | 400 |
| 47 | 408 |
| 48 | 416 |
| 49 | 424 |
| 50 | 432 |
| 51 | 440 |
| 52 | 448 |
| 53 | 456 |
| 54 | 464 |
| 55 | 472 |
| 56 | 480 |
| 57 | 488 |
| 58 | 496 |
| 59 | 504 |
| 60 | 512 |
| 61 | 528 |
| 62 | 544 |
| 63 | 560 |
| 64 | 576 |
| 65 | 592 |
| 66 | 608 |
| 67 | 624 |
| 68 | 640 |
| 69 | 656 |
| 70 | 672 |

TABLE 1-continued

| i | K |
| --- | --- |
| 71 | 688 |
| 72 | 704 |
| 73 | 720 |
| 74 | 736 |
| 75 | 752 |
| 76 | 768 |
| 77 | 784 |
| 78 | 800 |
| 79 | 816 |
| 80 | 832 |
| 81 | 848 |
| 82 | 864 |
| 83 | 880 |
| 84 | 896 |
| 85 | 912 |
| 86 | 928 |
| 87 | 944 |
| 88 | 960 |
| 89 | 976 |
| 90 | 992 |
| 91 | 1008 |
| 92 | 1024 |
| 93 | 1056 |
| 94 | 1088 |
| 95 | 1120 |
| 96 | 1152 |
| 97 | 1184 |
| 98 | 1216 |
| 99 | 1248 |
| 100 | 1280 |
| 101 | 1312 |
| 102 | 1344 |
| 103 | 1376 |
| 104 | 1408 |
| 105 | 1440 |
| 106 | 1472 |
| 107 | 1504 |
| 108 | 1536 |
| 109 | 1568 |
| 110 | 1600 |
| 111 | 1632 |
| 112 | 1664 |
| 113 | 1696 |
| 114 | 1728 |
| 115 | 1760 |
| 116 | 1792 |
| 117 | 1824 |
| 118 | 1856 |
| 119 | 1888 |
| 120 | 1920 |
| 121 | 1952 |
| 122 | 1984 |
| 123 | 2016 |
| 124 | 2048 |
| 125 | 2112 |
| 126 | 2176 |
| 127 | 2240 |
| 128 | 2304 |
| 129 | 2368 |
| 130 | 2432 |
| 131 | 2496 |
| 132 | 2560 |
| 133 | 2624 |
| 134 | 2688 |
| 135 | 2752 |
| 136 | 2816 |
| 137 | 2880 |
| 138 | 2944 |
| 139 | 3008 |
| 140 | 3072 |
| 141 | 3136 |
| 142 | 3200 |
| 143 | 3264 |
| 144 | 3328 |
| 145 | 3392 |
| 146 | 3456 |
| 147 | 3520 |
| 148 | 3584 |
| 149 | 3648 |
| 150 | 3712 |
| 151 | 3776 |
| 152 | 3840 |
| 153 | 3904 |
| 154 | 3968 |
| 155 | 4032 |
| 156 | 4096 |
| 157 | 4160 |
| 158 | 4224 |
| 159 | 4288 |
| 160 | 4352 |
| 161 | 4416 |
| 162 | 4480 |
| 163 | 4544 |
| 164 | 4608 |
| 165 | 4672 |
| 166 | 4736 |
| 167 | 4800 |
| 168 | 4864 |
| 169 | 4928 |
| 170 | 4992 |
| 171 | 5056 |
| 172 | 5120 |
| 173 | 5184 |
| 174 | 5248 |
| 175 | 5312 |
| 176 | 5376 |
| 177 | 5440 |
| 178 | 5504 |
| 179 | 5568 |
| 180 | 5632 |
| 181 | 5696 |
| 182 | 5760 |
| 183 | 5824 |
| 184 | 5888 |
| 185 | 5952 |
| 186 | 6016 |
| 187 | 6080 |
| 188 | 6144 |

Therefore, as shown in Table 1, if the transport block is mapped to one code block, it is preferable that the transport block has a specific length acquired when the length of a CRC attached to the transport block is subtracted from an block size (K) of the internal interleaver. Provided that the length of a CRC attached to the transport block is 24 bits, the transport block size (N) acquired when the transport block is mapped to one code block may be a K-24. That is, the transport block size according to this embodiment may be selected from combinations of the following Table 4.

TABLE 4

| i | N |
| --- | --- |
| 1 | 16 |
| 2 | 24 |
| 3 | 32 |
| 4 | 40 |
| 5 | 48 |
| 6 | 56 |
| 7 | 64 |
| 8 | 72 |
| 9 | 80 |
| 10 | 88 |
| 11 | 96 |
| 12 | 104 |
| 13 | 112 |
| 14 | 120 |
| 15 | 128 |
| 16 | 136 |
| 17 | 144 |
| 18 | 152 |

TABLE 4-continued

| i | N |
|---|---|
| 19 | 160 |
| 20 | 168 |
| 21 | 176 |
| 22 | 184 |
| 23 | 192 |
| 24 | 200 |
| 25 | 208 |
| 26 | 216 |
| 27 | 224 |
| 28 | 232 |
| 29 | 240 |
| 30 | 248 |
| 31 | 256 |
| 32 | 264 |
| 33 | 272 |
| 34 | 280 |
| 35 | 288 |
| 36 | 296 |
| 37 | 304 |
| 38 | 312 |
| 39 | 320 |
| 40 | 328 |
| 41 | 336 |
| 42 | 344 |
| 43 | 352 |
| 44 | 360 |
| 45 | 368 |
| 46 | 376 |
| 47 | 384 |
| 48 | 392 |
| 49 | 400 |
| 50 | 408 |
| 51 | 416 |
| 52 | 424 |
| 53 | 432 |
| 54 | 440 |
| 55 | 448 |
| 56 | 456 |
| 57 | 464 |
| 58 | 472 |
| 59 | 480 |
| 60 | 488 |
| 61 | 504 |
| 62 | 520 |
| 63 | 536 |
| 64 | 552 |
| 65 | 568 |
| 66 | 584 |
| 67 | 600 |
| 68 | 616 |
| 69 | 632 |
| 70 | 648 |
| 71 | 664 |
| 72 | 680 |
| 73 | 696 |
| 74 | 712 |
| 75 | 728 |
| 76 | 744 |
| 77 | 760 |
| 78 | 776 |
| 79 | 792 |
| 80 | 808 |
| 81 | 824 |
| 82 | 840 |
| 83 | 856 |
| 84 | 872 |
| 85 | 888 |
| 86 | 904 |
| 87 | 920 |
| 88 | 936 |
| 89 | 952 |
| 90 | 968 |
| 91 | 984 |
| 92 | 1000 |
| 93 | 1032 |
| 94 | 1064 |
| 95 | 1096 |
| 96 | 1128 |

TABLE 4-continued

| i | N |
|---|---|
| 97 | 1160 |
| 98 | 1192 |
| 99 | 1224 |
| 100 | 1256 |
| 101 | 1288 |
| 102 | 1320 |
| 103 | 1352 |
| 104 | 1384 |
| 105 | 1416 |
| 106 | 1448 |
| 107 | 1480 |
| 108 | 1512 |
| 109 | 1544 |
| 110 | 1576 |
| 111 | 1608 |
| 112 | 1640 |
| 113 | 1672 |
| 114 | 1704 |
| 115 | 1736 |
| 116 | 1768 |
| 117 | 1800 |
| 118 | 1832 |
| 119 | 1864 |
| 120 | 1896 |
| 121 | 1928 |
| 122 | 1960 |
| 123 | 1992 |
| 124 | 2024 |
| 125 | 2088 |
| 126 | 2152 |
| 127 | 2216 |
| 128 | 2280 |
| 129 | 2344 |
| 130 | 2408 |
| 131 | 2472 |
| 132 | 2536 |
| 133 | 2600 |
| 134 | 2664 |
| 135 | 2728 |
| 136 | 2792 |
| 137 | 2856 |
| 138 | 2920 |
| 139 | 2984 |
| 140 | 3048 |
| 141 | 3112 |
| 142 | 3176 |
| 143 | 3240 |
| 144 | 3304 |
| 145 | 3368 |
| 146 | 3432 |
| 147 | 3496 |
| 148 | 3560 |
| 149 | 3624 |
| 150 | 3688 |
| 151 | 3752 |
| 152 | 3816 |
| 153 | 3880 |
| 154 | 3944 |
| 155 | 4008 |
| 156 | 4072 |
| 157 | 4136 |
| 158 | 4200 |
| 159 | 4264 |
| 160 | 4328 |
| 161 | 4392 |
| 162 | 4456 |
| 163 | 4520 |
| 164 | 4584 |
| 165 | 4648 |
| 166 | 4712 |
| 167 | 4776 |
| 168 | 4840 |
| 169 | 4904 |
| 170 | 4968 |
| 171 | 5032 |
| 172 | 5096 |
| 173 | 5160 |
| 174 | 5224 |

TABLE 4-continued

| i | N |
|---|---|
| 175 | 5288 |
| 176 | 5352 |
| 177 | 5416 |
| 178 | 5480 |
| 179 | 5544 |
| 180 | 5608 |
| 181 | 5672 |
| 182 | 5736 |
| 183 | 5800 |
| 184 | 5864 |
| 185 | 5928 |
| 186 | 5992 |
| 187 | 6056 |
| 188 | 6120 |

In the meantime, a method for segmenting one transport block into two or more code blocks and performing a mapping process on the segmented code blocks will hereinafter be described in detail.

If one transport block is segmented into two or more code blocks, a CRC for the transport block is attached to the transport block as shown in FIGS. 2A-2B and 3, and a CRC for each code block is attached to each of the segmented code blocks. Under this assumption, in order to avoid the conventional practice of adding of dummy bits, it is preferable that the sum of the size of any one segmented code block and the size of a CRC attached to a corresponding code block is equal to an input bit size of the internal interleaver, as shown in Table 1.

Also, this embodiment of the present invention allows each of the segmented codewords to have the same size. Different-sized code blocks created by the segmentation of the transport block are caused by the limitation of the size of the internal interleaver of the turbo-encoder. If the transport block size is pre-established in consideration of the size of the internal interleaver of the turbo-encoder as described in this embodiment, there is no need for the individual code blocks to have different sizes.

Under the above-mentioned assumption, a method for establishing the size of the transport block according to this embodiment will hereinafter be described in detail.

Figure 4:
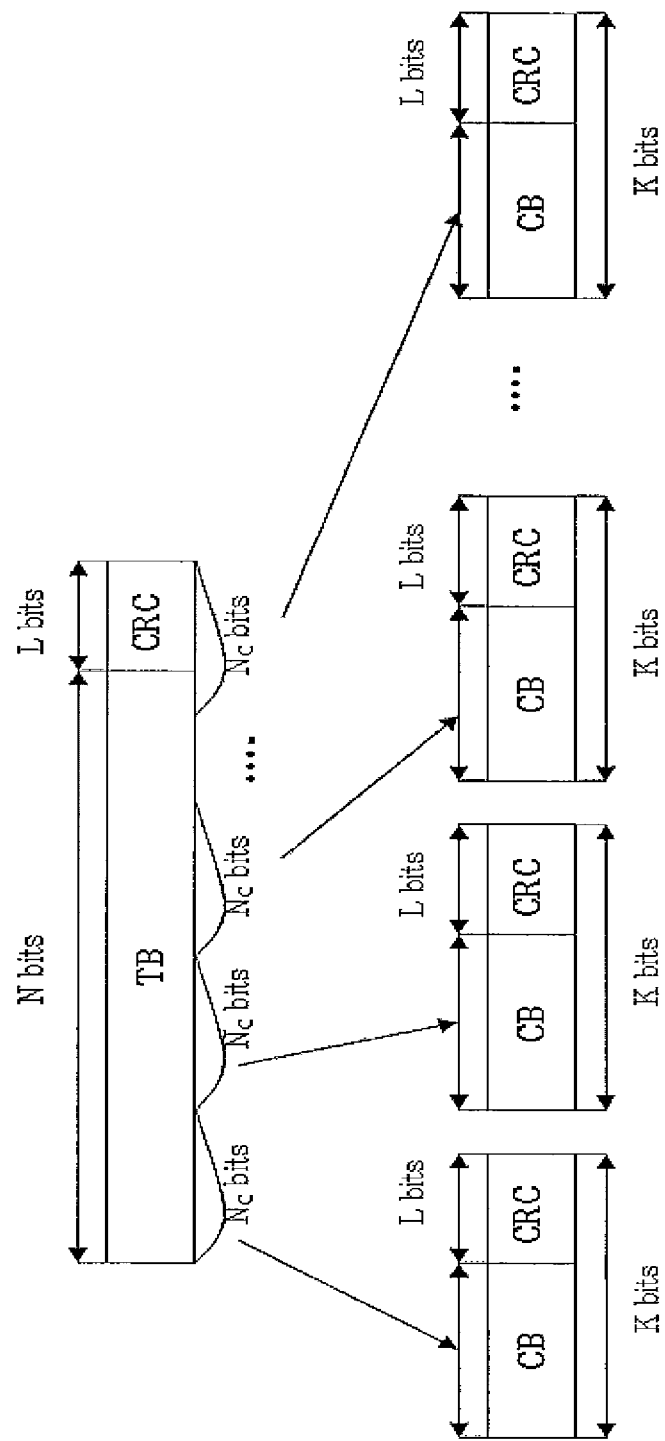
FIG. 4 is a conceptual diagram illustrating a principle of establishing the transport block size according to one embodiment of the present invention.

FIG. 4 is a conceptual diagram illustrating a principle of establishing the transport block size according to one embodiment of the present invention.

Firstly, it is assumed that an L-sized CRC is attached to an N-sized transport block (TB). If the CRC-attached transport block (TB) size is longer than the maximum length of the internal interleaver, the transport block is segmented into a plurality of code blocks (CBs). As can be seen from FIG. 4, the transport block (TB) size is segmented into M ($CB_1$~$CB_M$), each of which has the same length of $N_c$ bits.

In the meantime, the L-sized CRC is attached to each of the M code blocks.

In this way, provided that each of the segmented code blocks has the same length and the lengths of two attached CRCs are considered, the transport block size N can be represented by the following equation 1:

$$N+L*M+L=M*(Nc+L) \Rightarrow N=M*Nc-L \quad \text{[Equation 1]}$$

If the CRC of 24 bits is used, the above Equation 1 may be represented by another equation of N=M*Nc−24.

Each of the segmented code blocks includes the CRC, such that the CRC-attached code blocks are applied to the internal interleaver of the turbo-encoder. Therefore, as shown in FIG. 4, the length of the CRC-attached code blocks is equal to the internal interleaver's block size (K) shown in Table 1, as represented by the following equation 2:

$$Nc+L=K \quad \text{[Equation 2]}$$

Based on the above-mentioned description, this embodiment provides a method for using the following transport block sizes shown in the following Table 2. The following Table 2 shows a variety of cases illustrating a relationship between a single transport block and a maximum of 25 code blocks mapped to this single transport block.

TABLE 2

| M | N |
|---|---|
| 2 | 6200 |
| 2 | 6328 |
| 2 | 6456 |
| 2 | 6584 |
| 2 | 6712 |
| 2 | 6840 |
| 2 | 6968 |
| 2 | 7096 |
| 2 | 7224 |
| 2 | 7352 |
| 2 | 7480 |
| 2 | 7608 |
| 2 | 7736 |
| 2 | 7864 |
| 2 | 7992 |
| 2 | 8120 |
| 2 | 8248 |
| 2 | 8376 |
| 2 | 8504 |
| 2 | 8632 |
| 2 | 8760 |
| 2 | 8888 |
| 2 | 9016 |
| 2 | 9144 |
| 2 | 9272 |
| 2 | 9400 |
| 2 | 9528 |
| 2 | 9656 |
| 2 | 9784 |
| 2 | 9912 |
| 2 | 10040 |
| 2 | 10168 |
| 2 | 10296 |
| 2 | 10424 |
| 2 | 10552 |
| 2 | 10680 |
| 2 | 10808 |
| 2 | 10936 |
| 2 | 11064 |
| 2 | 11192 |
| 2 | 11320 |
| 2 | 11448 |
| 2 | 11576 |
| 2 | 11704 |
| 2 | 11832 |
| 2 | 11960 |
| 2 | 12088 |
| 2 | 12216 |
| 3 | 12384 |
| 3 | 12576 |
| 3 | 12768 |
| 3 | 12960 |
| 3 | 13152 |
| 3 | 13344 |
| 3 | 13536 |
| 3 | 13728 |
| 3 | 13920 |
| 3 | 14112 |
| 3 | 14304 |
| 3 | 14496 |
| 3 | 14688 |
| 3 | 14880 |
| 3 | 15072 |
| 3 | 15264 |

TABLE 2-continued

| M | N |
|---|---|
| 3 | 15456 |
| 3 | 15648 |
| 3 | 15840 |
| 3 | 16032 |
| 3 | 16224 |
| 3 | 16416 |
| 3 | 16608 |
| 3 | 16800 |
| 3 | 16992 |
| 3 | 17184 |
| 3 | 17376 |
| 3 | 17568 |
| 3 | 17760 |
| 3 | 17952 |
| 3 | 18144 |
| 3 | 18336 |
| 4 | 18568 |
| 4 | 18824 |
| 4 | 19080 |
| 4 | 19336 |
| 4 | 19592 |
| 4 | 19848 |
| 4 | 20104 |
| 4 | 20360 |
| 4 | 20616 |
| 4 | 20872 |
| 4 | 21128 |
| 4 | 21384 |
| 4 | 21640 |
| 4 | 21896 |
| 4 | 22152 |
| 4 | 22408 |
| 4 | 22664 |
| 4 | 22920 |
| 4 | 23176 |
| 4 | 23432 |
| 4 | 23688 |
| 4 | 23944 |
| 4 | 24200 |
| 4 | 24456 |
| 5 | 24496 |
| 5 | 24816 |
| 5 | 25136 |
| 5 | 25456 |
| 5 | 25776 |
| 5 | 26096 |
| 5 | 26416 |
| 5 | 26736 |
| 5 | 27056 |
| 5 | 27376 |
| 5 | 27696 |
| 5 | 28016 |
| 5 | 28336 |
| 5 | 28656 |
| 5 | 28976 |
| 5 | 29296 |
| 5 | 29616 |
| 5 | 29936 |
| 5 | 30256 |
| 5 | 30576 |
| 6 | 30936 |
| 6 | 31320 |
| 6 | 31704 |
| 6 | 32088 |
| 6 | 32472 |
| 6 | 32856 |
| 6 | 33240 |
| 6 | 33624 |
| 6 | 34008 |
| 6 | 34392 |
| 6 | 34776 |
| 6 | 35160 |
| 6 | 35544 |
| 6 | 35928 |
| 6 | 36312 |
| 6 | 36696 |
| 7 | 36992 |
| 7 | 37440 |

TABLE 2-continued

| M | N |
|---|---|
| 7 | 37888 |
| 7 | 38336 |
| 7 | 38784 |
| 7 | 39232 |
| 7 | 39680 |
| 7 | 40128 |
| 7 | 40576 |
| 7 | 41024 |
| 7 | 41472 |
| 7 | 41920 |
| 7 | 42368 |
| 7 | 42816 |
| 8 | 43304 |
| 8 | 43816 |
| 8 | 44328 |
| 8 | 44840 |
| 8 | 45352 |
| 8 | 45864 |
| 8 | 46376 |
| 8 | 46888 |
| 8 | 47400 |
| 8 | 47912 |
| 8 | 48424 |
| 8 | 48936 |
| 8 | 49296 |
| 9 | 49872 |
| 9 | 50448 |
| 9 | 51024 |
| 9 | 51600 |
| 9 | 52176 |
| 9 | 52752 |
| 9 | 53328 |
| 9 | 53904 |
| 9 | 54480 |
| 9 | 55056 |
| 10 | 55416 |
| 10 | 56056 |
| 10 | 56696 |
| 10 | 57336 |
| 10 | 57976 |
| 10 | 58616 |
| 10 | 59256 |
| 10 | 59896 |
| 10 | 60536 |
| 10 | 61176 |
| 11 | 61664 |
| 11 | 62368 |
| 11 | 63072 |
| 11 | 63776 |
| 11 | 64480 |
| 11 | 65184 |
| 11 | 65888 |
| 11 | 66592 |
| 11 | 67296 |
| 12 | 68040 |
| 12 | 68808 |
| 12 | 69576 |
| 12 | 70344 |
| 12 | 71112 |
| 12 | 71880 |
| 12 | 72648 |
| 12 | 73416 |
| 13 | 73712 |
| 13 | 74544 |
| 13 | 75376 |
| 13 | 76208 |
| 13 | 77040 |
| 13 | 77872 |
| 13 | 78704 |
| 13 | 79536 |
| 14 | 80280 |
| 14 | 81176 |
| 14 | 82072 |
| 14 | 82968 |
| 14 | 83864 |
| 14 | 84760 |
| 14 | 85656 |
| 15 | 86016 |

TABLE 2-continued

| M | N |
|---|---|
| 15 | 86976 |
| 15 | 87936 |
| 15 | 88896 |
| 15 | 89856 |
| 15 | 90816 |
| 15 | 91776 |
| 16 | 92776 |
| 16 | 93800 |
| 16 | 94824 |
| 16 | 95848 |
| 16 | 96872 |
| 16 | 97896 |
| 17 | 98576 |
| 17 | 99664 |
| 17 | 100752 |
| 17 | 101840 |
| 17 | 102928 |
| 17 | 104016 |
| 18 | 104376 |
| 18 | 105528 |
| 18 | 106680 |
| 18 | 107832 |
| 18 | 108984 |
| 18 | 110136 |
| 19 | 110176 |
| 19 | 111392 |
| 19 | 112608 |
| 19 | 113824 |
| 19 | 115040 |
| 19 | 116256 |
| 20 | 117256 |
| 20 | 118536 |
| 20 | 119816 |
| 20 | 121096 |
| 20 | 122376 |
| 21 | 123120 |
| 21 | 124464 |
| 21 | 125808 |
| 21 | 127152 |

TABLE 2-continued

| M | N |
|---|---|
| 21 | 128496 |
| 22 | 130392 |
| 22 | 131800 |
| 22 | 133208 |
| 22 | 134616 |
| 23 | 134848 |
| 23 | 136320 |
| 23 | 137792 |
| 23 | 139264 |
| 23 | 140736 |
| 24 | 142248 |
| 24 | 143784 |
| 24 | 145320 |
| 24 | 146856 |
| 25 | 148176 |
| 25 | 149776 |
| 25 | 151376 |
| 25 | 152976 |

The Table 2 satisfies the above equations 1 and 2, and shows that up to the case when one transport block is segmented into 25 code blocks. Within the scope of satisfying the equations 1 and 2, those skilled in the art can easily appreciate an additional transport block (TB) size on the analogy of values shown in Table 2.

Since signal transmission is conducted by the above-mentioned embodiment of the present invention, the addition of dummy bit due to the limitation of the block size of the turbo-encoder can be removed, such that a system performance or throughput can be increased.

Meanwhile, in the case of considering not only a first case in which a transport block is mapped to one code block, but also a second case in which a transport block is segmented into two or more code blocks, the size of an available transport block can be represented by the following Table 3.

TABLE 3

| 16 | 392 | 1096 | 3176 | 6200 | 12216 | 22152 | 37440 | 62368 | 101840 |
|---|---|---|---|---|---|---|---|---|---|
| 24 | 400 | 1128 | 3240 | 6328 | 12384 | 22408 | 37888 | 63072 | 102928 |
| 32 | 408 | 1160 | 3304 | 6456 | 12576 | 22664 | 38336 | 63776 | 104016 |
| 40 | 416 | 1192 | 3368 | 6584 | 12768 | 22920 | 38784 | 64480 | 104376 |
| 48 | 424 | 1224 | 3432 | 6712 | 12960 | 23176 | 39232 | 65184 | 105528 |
| 56 | 432 | 1256 | 3496 | 6840 | 13152 | 23432 | 39680 | 65888 | 106680 |
| 64 | 440 | 1288 | 3560 | 6968 | 13344 | 23688 | 40128 | 66592 | 107832 |
| 72 | 448 | 1320 | 3624 | 7096 | 13536 | 23944 | 40576 | 67296 | 108984 |
| 80 | 456 | 1352 | 3688 | 7224 | 13728 | 24200 | 41024 | 68040 | 110136 |
| 88 | 464 | 1384 | 3752 | 7352 | 13920 | 24456 | 41472 | 68808 | 110176 |
| 96 | 472 | 1416 | 3816 | 7480 | 14112 | 24496 | 41920 | 69576 | 111392 |
| 104 | 480 | 1448 | 3880 | 7608 | 14304 | 24816 | 42368 | 70344 | 112608 |
| 112 | 488 | 1480 | 3944 | 7736 | 14496 | 25136 | 42816 | 71112 | 113824 |
| 120 | 504 | 1512 | 4008 | 7864 | 14688 | 25456 | 43304 | 71880 | 115040 |
| 128 | 520 | 1544 | 4072 | 7992 | 14880 | 25776 | 43816 | 72648 | 116256 |
| 136 | 536 | 1576 | 4136 | 8120 | 15072 | 26096 | 44328 | 73416 | 117256 |
| 144 | 552 | 1608 | 4200 | 8248 | 15264 | 26416 | 44840 | 73712 | 118536 |
| 152 | 568 | 1640 | 4264 | 8376 | 15456 | 26736 | 45352 | 74544 | 119816 |
| 160 | 584 | 1672 | 4328 | 8504 | 15648 | 27056 | 45864 | 75376 | 121096 |
| 168 | 600 | 1704 | 4392 | 8632 | 15840 | 27376 | 46376 | 76208 | 122376 |
| 176 | 616 | 1736 | 4456 | 8760 | 16032 | 27696 | 46888 | 77040 | 123120 |
| 184 | 632 | 1768 | 4520 | 8888 | 16224 | 28016 | 47400 | 77872 | 124464 |
| 192 | 648 | 1800 | 4584 | 9016 | 16416 | 28336 | 47912 | 78704 | 125808 |
| 200 | 664 | 1832 | 4648 | 9144 | 16608 | 28656 | 48424 | 79536 | 127152 |
| 208 | 680 | 1864 | 4712 | 9272 | 16800 | 28976 | 48936 | 80280 | 128496 |
| 216 | 696 | 1896 | 4776 | 9400 | 16992 | 29296 | 49296 | 81176 | 130392 |
| 224 | 712 | 1928 | 4840 | 9528 | 17184 | 29616 | 49872 | 82072 | 131800 |
| 232 | 728 | 1960 | 4904 | 9656 | 17376 | 29936 | 50448 | 82968 | 133208 |
| 240 | 744 | 1992 | 4968 | 9784 | 17568 | 30256 | 51024 | 83864 | 134616 |
| 248 | 760 | 2024 | 5032 | 9912 | 17760 | 30576 | 51600 | 84760 | 134848 |
| 256 | 776 | 2088 | 5096 | 10040 | 17952 | 30936 | 52176 | 85656 | 136320 |
| 264 | 792 | 2152 | 5160 | 10168 | 18144 | 31320 | 52752 | 86016 | 137792 |
| 272 | 808 | 2216 | 5224 | 10296 | 18336 | 31704 | 53328 | 86976 | 139264 |
| 280 | 824 | 2280 | 5288 | 10424 | 18568 | 32088 | 53904 | 87936 | 140736 |

TABLE 3-continued

| | | | | | | | | |
|---|---|---|---|---|---|---|---|---|
| 288 | 840 | 2344 | 5352 | 10552 | 18824 | 32472 | 54480 | 88896 | 142248 |
| 296 | 856 | 2408 | 5416 | 10680 | 19080 | 32856 | 55056 | 89856 | 143784 |
| 304 | 872 | 2472 | 5480 | 10808 | 19336 | 33240 | 55416 | 90816 | 145320 |
| 312 | 888 | 2536 | 5544 | 10936 | 19592 | 33624 | 56056 | 91776 | 146856 |
| 320 | 904 | 2600 | 5608 | 11064 | 19848 | 34008 | 56696 | 92776 | 148176 |
| 328 | 920 | 2664 | 5672 | 11192 | 20104 | 34392 | 57336 | 93800 | 149776 |
| 336 | 936 | 2728 | 5736 | 11320 | 20360 | 34776 | 57976 | 94824 | 151376 |
| 344 | 952 | 2792 | 5800 | 11448 | 20616 | 35160 | 58616 | 95848 | 152976 |
| 352 | 968 | 2856 | 5864 | 11576 | 20872 | 35544 | 59256 | 96872 | |
| 360 | 984 | 2920 | 5928 | 11704 | 21128 | 35928 | 59896 | 97896 | |
| 368 | 1000 | 2984 | 5992 | 11832 | 21384 | 36312 | 60536 | 98576 | |
| 376 | 1032 | 3048 | 6056 | 11960 | 21640 | 36696 | 61176 | 99664 | |
| 384 | 1064 | 3112 | 6120 | 12088 | 21896 | 36992 | 61664 | 100752 | |

When implementing the above described methodology, when a terminal identifies that the length of the CRC-attached transport block is larger than the largest interleaver block size, the terminal may determine the predetermined number of code blocks from a look-up table or may calculate the predetermined number of code blocks based upon a formula. The calculation may include calculating the predetermined number of code blocks based on the following equation:

$C = \lceil B/(Z-L) \rceil$, where $\lceil \ \rceil$ represents a ceiling function,
C is the predetermined number of code blocks,
B is the length of the CRC-attached transport block,
Z is the largest interleaver block size, and
L is the first CRC length.

A signal transmission method and device according to this embodiment enables the transport block to have a predetermined length corresponding to any one of various values shown in Table 3. Table 3 shows the available transport block (TB) sizes which obviates the need for the conventional practice of inserting the dummy bit into the signal. The signal transmission method may allow sub-sets of Table 3 to be shared between a transmission end and a reception end in consideration of signaling overhead and the like, instead of using all the values of Table 36.

In the meantime, in order to inform the reception end of the transport block size, the transmission end is able to represent the transport block size by a combination of a modulation and coding scheme (MCS), and the size of allocated resources. By means of a channel quality indicator transferred from the reception end, a scheduler decides the MCS. The size of allocated resources is decided in consideration of not only resources for transferring control information but also other resources for a reference signal for channel estimation.

Figure 5:
FIG. 5 shows an example of a resource structure according to the present invention.

FIG. 5 shows an example of a resource structure according to the present invention.

Referring to FIG. 5, a horizontal axis indicates a time domain, and a vertical axis indicates a frequency domain. On the assumption that the resource structure of FIG. 5 is used, it is assumed that the resources for transferring control information correspond to 3 symbols and two transmission (Tx) antennas are used, one resource block (RB) includes 120 resource elements (REs) capable of being used to transmit data.

In this case, if it is assumed that the modulation rate is 64 QAM, the coding rate is 0.6504, and the number of allocated resource blocks (RBs) is 10, the size of a data block capable of being transmitted is 4658 bits. These 4658 bits are located between 4608 bits and 4672 bits of Table 1. If it is assumed that the size of the transmittable data block is set to the 4608 bits or the 4672 bits, the data block size can be decided by various modulation and coding rates and the size of allocated resources.

As previously described in the above-mentioned example, if the size of an actually-transmittable data block is different from the size of a supportable data block, the size of the actually-transmittable data block can be decided by any of the following rules i)~iii):

A method for deciding the actually-transmittable data block size as a maximally-supportable data block size which is equal to or smaller than the actually-transmittable data block size;

A method for deciding the actually-transmittable data block size as a minimally-supportable data block size larger than the actually-transmittable data block size; and A method for deciding the actually-transmittable data block size as a supportable data block size which has a minimum difference with the actually-transmittable data block size.

In this case, if one transport block is transferred via one code block, the data block may correspond to the transport block. Otherwise, if one transport block is transferred via two or more code blocks, the data block may be considered to be the code blocks.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents. For example, although the signal transmission method according to the present invention has been disclosed on the basis of the 3GPP LTE system, it can also be applied to other communication systems, each of which has a limitation in the block size during the encoding process and uses a combination of predetermined transport block sizes.

If a transport block received from an upper layer is segmented into a plurality of code blocks, and the code blocks are encoded by a turbo-encoder, the signal transmission method according to the present invention is able to remove the added dummy bits caused by a limitation of the block size of the internal interleaver of the turbo-encoder, such that it can effectively transmit signals.

The invention claimed is:

1. A method of performing, by a first device, channel coding for data to be transmitted to a second device, the method comprising:
   determining a size of a transport block for the data;
   attaching a CRC code to the transport block having the determined size to produce a CRC-attached transport block; and
   encoding the CRC-attached transport block by a turbo-encoder,
   wherein the determining the size of the transport block comprises determining the size from among a plurality of transport block sizes that are predetermined so that a sum of any one of the transport block sizes and a size of the CRC code attached to the transport block is equal to a block size of an internal interleaver of the turbo-encoder, and wherein the plurality of transport block sizes comprise 16, 24, 32, 40, 56, 72, 88, 104, 120, 136, 144, 152, 176, 208, 224, 256, 280, 288, 296, 328, 336, 344, 376, 392, 408, 424, 440, 456, 472, 488, 504, 520, 536, 552, 568, 584, 600, 616, 632, 648, 680, 696, 712, 744, 776, 808, 840, 872, 904, 936, 968, 1000, 1032, 1064, 1096, 1128, 1160, 1192, 1224, 1256, 1288, 1320, 1352, 1384, 1416, 1480, 1544, 1608, 1672, 1736, 1800, 1864, 1928, 1992, 2024, 2088, 2152, 2216, 2280, 2344, 2408, 2472, 2536, 2600, 2664, 2728, 2792, 2856, 2984, 3112, 3240, 3368, 3496, 3624, 3752, 3880, 4008, 4136, 4264, 4392, 4584, 4776, 4968, 5160, 5352, 5544, 5736, 5992.

2. The method of claim 1, further comprising:
identifying whether a size of the CRC-attached transport block is larger than a predetermined size.

3. The method of claim 2, wherein the predetermined size corresponds to a maximum block size of an internal interleaver of the turbo-encoder.

4. The method of claim 2, wherein the predetermined size is 6144.

5. The method of claim 1, wherein the size of the CRC code attached to the transport block is 24.

6. A device configured to perform channel coding for data to be transmitted to an external device, the device configured to:
determine a size of a transport block for the data;
attach a CRC code to the transport block having the determined size to produce a CRC-attached transport block; and
encode the CRC-attached transport block by a turbo-encoder, wherein the controller is configured to determine the size of the transport block from among a plurality of transport block sizes that are predetermined so that a sum of any one of the transport block sizes and a size of the CRC code attached to the transport block is equal to a block size of an internal interleaver of the turbo-encoder, and wherein the plurality of transport block sizes comprise 16, 24, 32, 40, 56, 72, 88, 104, 120, 136, 144, 152, 176, 208, 224, 256, 280, 288, 296, 328, 336, 344, 376, 392, 408, 424, 440, 456, 472, 488, 504, 520, 536, 552, 568, 584, 600, 616, 632, 648, 680, 696, 712, 744, 776, 808, 840, 872, 904, 936, 968, 1000, 1032, 1064, 1096, 1128, 1160, 1192, 1224, 1256, 1288, 1320, 1352, 1384, 1416, 1480, 1544, 1608, 1672, 1736, 1800, 1864, 1928, 1992, 2024, 2088, 2152, 2216, 2280, 2344, 2408, 2472, 2536, 2600, 2664, 2728, 2792, 2856, 2984, 3112, 3240, 3368, 3496, 3624, 3752, 3880, 4008, 4136, 4264, 4392, 4584, 4776, 4968, 5160, 5352, 5544, 5736, 5992.

7. The device of claim 6, wherein the device is further configured to:
identify whether a size of the CRC-attached transport block is larger than a predetermined size.

8. The device of claim 7, wherein the predetermined size corresponds to a maximum block size of an internal interleaver of the turbo-encoder.

9. The device of claim 7, wherein the predetermined size is 6144.

10. The device of claim 6, wherein the size of the CRC code attached to the transport block is 24.

* * * * *